(12) United States Patent
Jacquet et al.

(10) Patent No.: US 7,280,378 B2
(45) Date of Patent: Oct. 9, 2007

(54) CAM CELLS AND CAM MATRIX MADE UP OF A NETWORK OF SUCH MEMORY CELLS

(75) Inventors: François Jacquet, Froges (FR); Thierry Devoivre, Gieres (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 11/428,471

(22) Filed: Jul. 3, 2006

(65) Prior Publication Data
US 2007/0057700 A1    Mar. 15, 2007

(30) Foreign Application Priority Data
Jul. 5, 2005    (FR)    .................................. 05 07149

(51) Int. Cl.
G11C 15/00    (2006.01)
(52) U.S. Cl. ........................................ 365/49; 365/154
(58) Field of Classification Search .................. 365/49, 365/154, 156
See application file for complete search history.

(56) References Cited

U.S. PATENT DOCUMENTS 6,674,660 B2 *    1/2004    Shau ............................ 365/49
6,822,300 B2 *    11/2004   Nii .............................. 257/390
6,888,730 B2 *    5/2005    Foss et al. .................... 365/49

FOREIGN PATENT DOCUMENTS

EP    1187142    3/2002
EP    1369877    12/2003

* cited by examiner

Primary Examiner—Vu A. Le
(74) Attorney, Agent, or Firm—Lisa K. Jorgenson; Allen, Dyer, Doppelt, Milbrath & Gilchrist, P.A.

(57) ABSTRACT

A content addressable memory (CAM) includes first and second memory circuits and a comparison circuit. The first memory circuit includes first and second sets of transistors for the storage of first and second compare data. The second memory circuit includes first and second sets of transistors for the storage of enabling or disabling data. The comparison circuit includes first and second sets of comparison transistors which respectively provide for the comparison of the first and second compare data with first and second input data under the control of an output signal from the second memory circuit. The transistors of the first and second sets of transistors of the memory circuits each includes a transistor of a first conductivity type and a transistor of a second conductivity type. The transistors of the second conductivity type are formed on the same first active zone of the semiconductor substrate. The first and second sets of comparison transistors of the comparison circuit are formed in separate active zones, respectively, which are mutually separated by the first active zone.

27 Claims, 5 Drawing Sheets

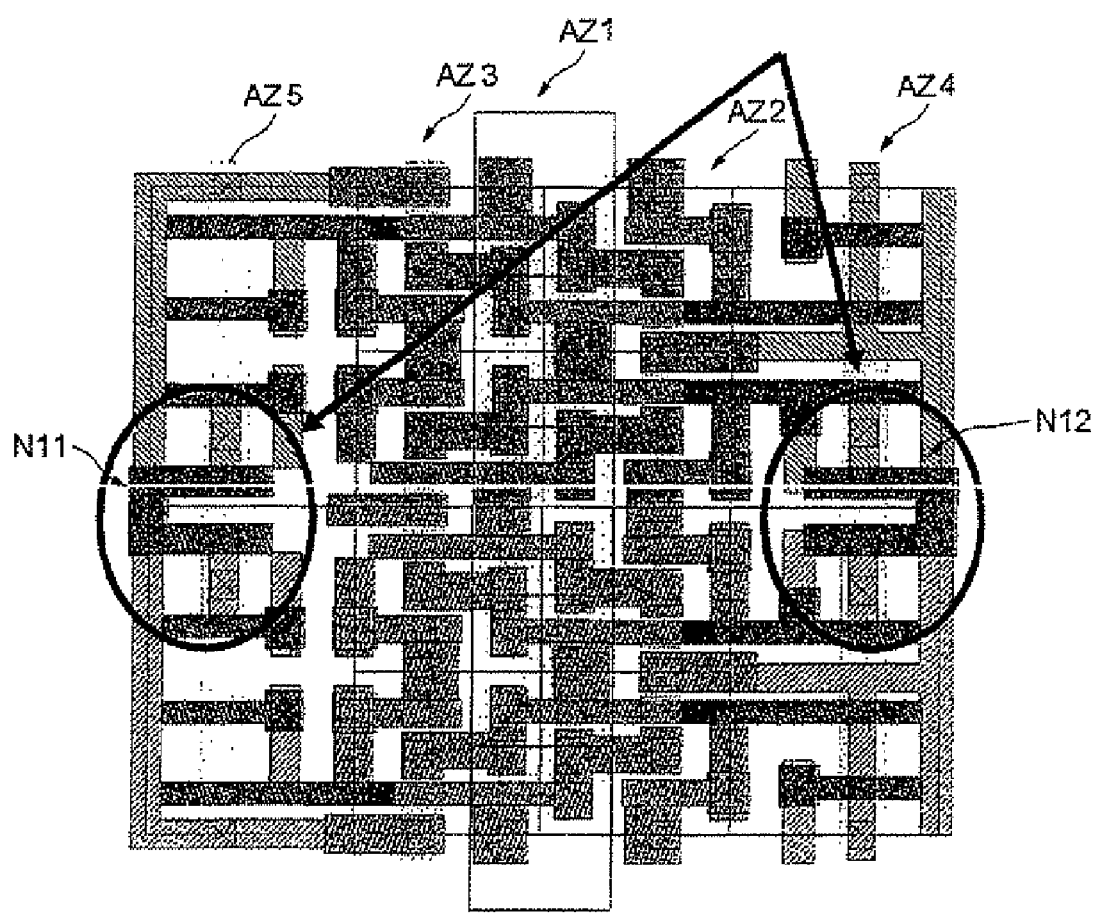

CAM CELLS AND CAM MATRIX MADE UP OF A NETWORK OF SUCH MEMORY CELLS

FIELD OF THE INVENTION

The invention relates to content addressable memory (CAM) cells.

BACKGROUND OF THE INVENTION

Content addressable memory cells are used, for example, to determine a correspondence or match between first data stored in the cell and second data presented as input to the cell. The input data can be made up of a header of a data packet containing the address of a remote computer of a computer network, for example. The memory cells of a CAM matrix store the addresses of all of the computers of the network. The memory matrix then determines if there is a correspondence or match between the address conveyed by the header and the address of the computers in the network.

To achieve this, a CAM matrix is made up of a network of individual CAM cells. FIG. 1 shows the general architecture of a conventional CAM cell. Such a cell comprises a first memory circuit 10, a second memory circuit 12 and a comparison circuit 14. The first and second memory circuits 10 and 12 are for storing a data value and a masking value, respectively. The masking value is used to enable or disable the comparison circuit 14. The first and second memory circuits 10, 12 are respectively addressable by word lines WLD and WLM, and by bit lines BLT and BLF.

The comparison circuit 14 is used to compare data signals dt and df corresponding to a data value stored in the first memory circuit 10 with data signals ct and cf presented at the input of the memory cell. When the second memory circuit 12 stores a value for enabling the CAM cell, the comparison circuit 14 carries out the comparison between a value presented at the input of the cell and a value stored in the memory in the first memory circuit 10.

In the case of a correspondence, the voltage level of a correspondence line C at the output of the comparison circuit 14 remains unchanged. In contrast, if there is no correspondence, the voltage level on the correspondence line C switches, for example, from the upper level to the lower level.

FIG. 2 shows a physical embodiment of a conventional CAM cell on a silicon substrate. In the illustrated example, a CAM cell comprises eighteen transistors to create the first memory circuit 10, the second memory circuit 12 and the comparison circuit 14.

The first memory cell 10 comprises six transistors; four transistors N1, N2, P1 and P2 for storing data and two access transistors T3 and T4. Likewise, the second memory circuit 12 comprises four storage transistors N3, N4, P3 and P4 as well as two access transistors T1 and T2. The comparison circuit 14 also comprises six transistors; four comparison transistors N5, N7, N8 and N10 and two enabling transistors N6 and N9.

For the purpose of being able to drive the comparison circuit 14, the output of the second memory circuit 12 is connected to the enabling transistors N6 and N9 via a polysilicon track MT. More particularly, the gates of the transistors N4 and P4 are connected via the track MT to the gates of the transistors N6 and N9. Likewise, to transfer the data values dt and df from the first memory circuit 10 to the comparison circuit 14, the gates of the storage transistors N1, P1 and N2, P2 are connected to the gates of the comparison transistors N5 and N8, respectively.

As illustrated in FIG. 2, the traditional implementation of a CAM cell has a number of considerable disadvantages. First, the polysilicon tracks MT at the comparison circuit 14 in particular, have a number of angles, particularly due to the fact that the transistors of the memory circuits and of the comparison circuit are formed in different directions, the former vertically and the latter horizontally, for example. The configuration of the polysilicon tracks is then largely detrimental to the density of the installation, and makes checking the transistors relatively difficult.

Furthermore, the configuration of the junctions of the transistors generate, in this type of installation, a stress at the lateral STI (shallow trench isolation) regions which tends to degrade the properties of the transistor. Yet, it is not possible to increase the size of the transistors, and in particular, the length of the channel without dismantling the whole cell.

SUMMARY OF THE INVENTION

In view of the foregoing background, an object of the invention is to overcome the disadvantages of conventional CAM cells.

This and other objects, advantages and features in accordance with the invention are provided by a CAM cell on a semiconductor substrate comprising a first memory circuit, a second memory circuit and a comparison circuit. The first memory circuit may comprise first and second sets of transistors for the storage of first and second compare data. The second memory circuit may comprise first and second sets of transistors for the storage of data for enabling or disabling the CAM cell. The comparison circuit may comprise first and second sets of transistors which respectively provide for the comparison of the first and second compare data with first and second input data under the control of an output signal from the second memory circuit.

The transistors of the first and second sets of transistors of the first memory circuit and of the second memory circuit may each comprise at least one transistor of a first conductivity type and at least one transistor of a second conductivity type. The transistors of the second conductivity type may be placed in the same first active zone of the semiconductor substrate. The transistors of the first conductivity type of the first set of transistors and the transistors of the second set of transistors of the first and second memory circuits may be placed in second and third separate active zones, respectively, which are separated by the first active installation zone of the transistors of the second conductivity type.

The first and second sets of transistors of the comparison circuit may be placed in fourth and fifth separate active zones, respectively, which are mutually separated from the first active installation zone of the transistors of the second conductivity type.

According to another feature of the invention, the first memory circuit may comprise first and second word lines formed in the second and third active zones, respectively. The first memory circuit may comprise first and second bit lines formed in the second and third active zones, respectively.

The second memory circuit may also comprise first and second word lines formed in the second and third active zones, respectively. The second memory circuit may also comprise first and second bit lines formed in the second and third active zones, respectively.

According to yet another feature of the invention, the gates of the transistors of the first set of transistors of the first memory circuit may be connected to the gate of a comparison transistor of the first set of transistors of the comparison circuit by a substantially straight polysilicon track. The gate of the transistors of the second set of transistors of the first memory circuit may be connected to the gate of a comparison transistor of the second set of transistors of the comparison circuit by a substantially straight polysilicon track.

According to yet another feature of the invention, the gate of the transistors of one of the first and second sets of transistors of the second memory circuit may be connected to the gate of an enabling transistor of the first and second sets of transistors of the comparison circuit by a substantially straight polysilicon track.

In one embodiment, the first and second sets of transistors of the comparison circuit may each comprise first and second comparison transistors and an enabling transistor. The first and second sets of transistors may each further comprises an isolation transistor connected to a corresponding isolation transistor of a comparison circuit of an adjacent CAM cell.

Another object of the invention is to provide a CAM matrix comprising a network of CAM cells as defined above.

BRIEF DESCRIPTION OF THE DRAWINGS

Other aims, features and advantages of the invention shall emerge from reading the following description, given solely by way of non-limiting examples and with reference to the appended drawings in which:

FIG. 5 shows an installation example of CAM cells for forming a CAM matrix.

DETAILED DESCRIPTION OF THE PREFERRED EMBODIMENTS

Figure 1:
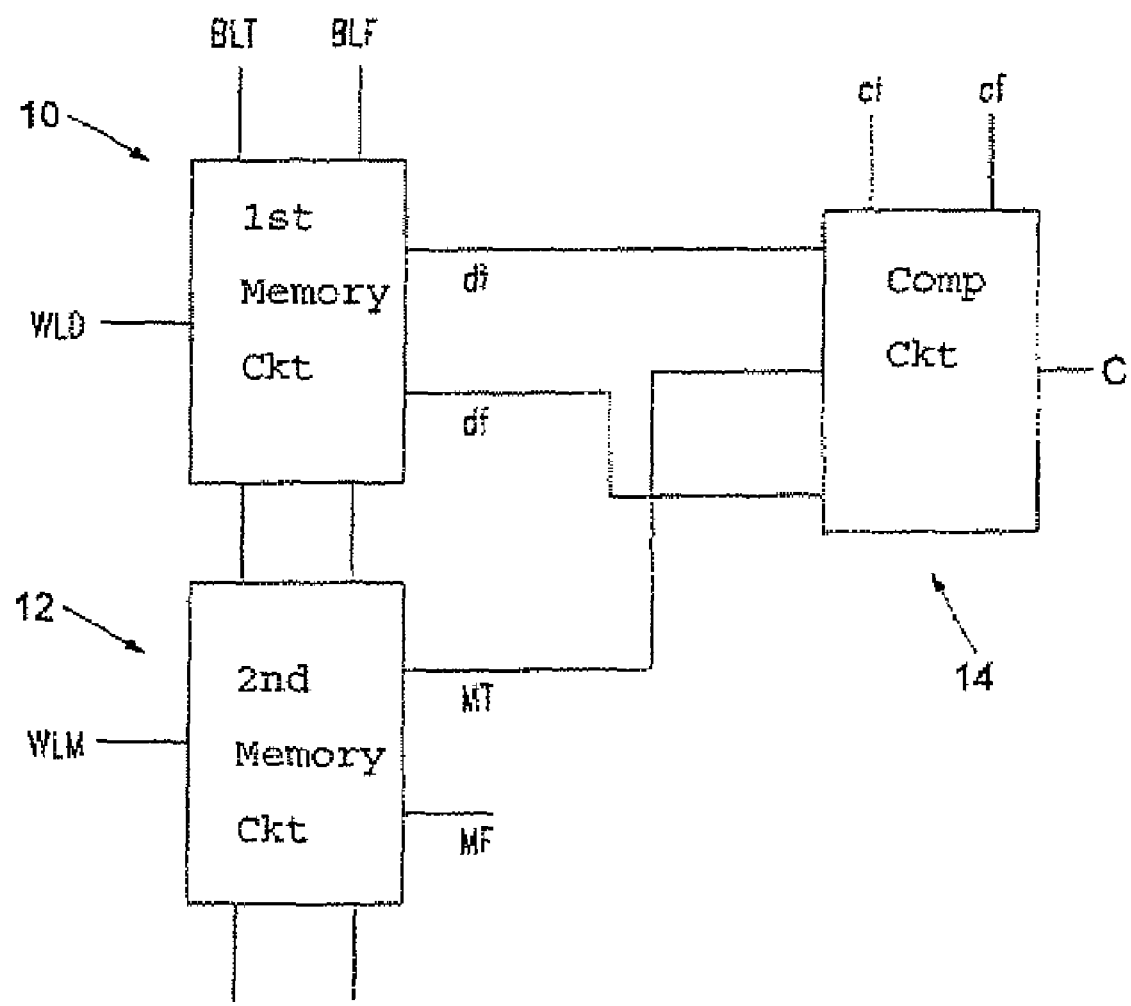
FIG. 1 is a block diagram of a CAM cell in accordance with the prior art.
Figure 2:
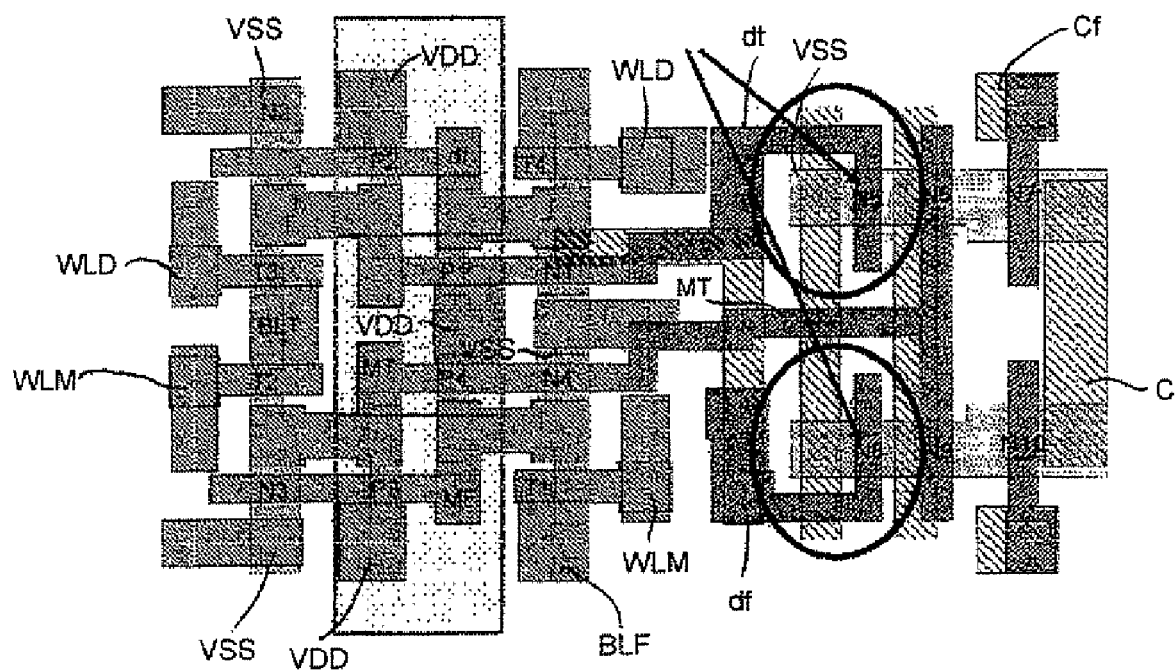
FIG. 2 is a diagram of a CAM cell on a semiconductor substrate in accordance with the prior art.
Figure 3:
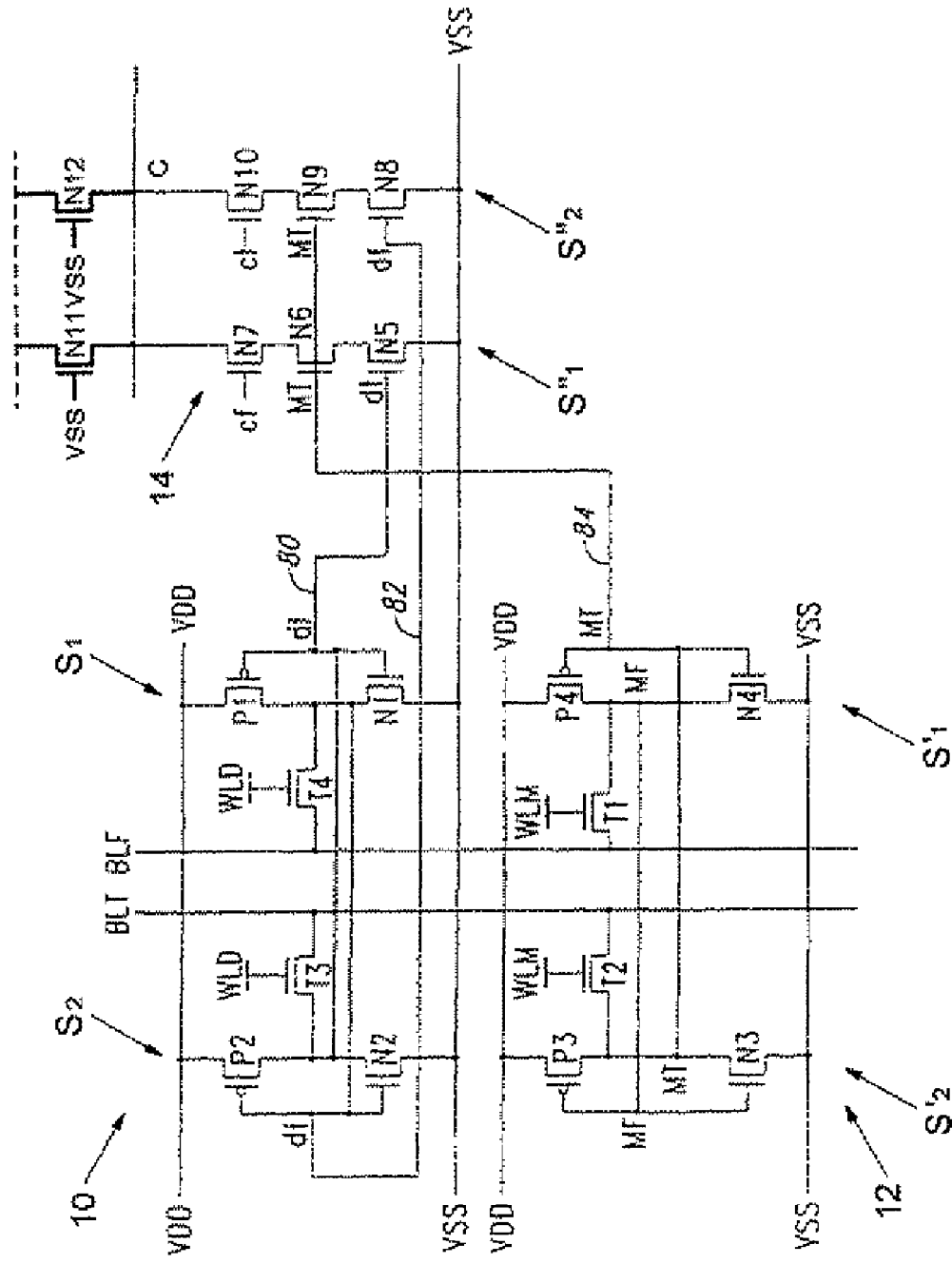
FIG. 3 is a circuit diagram of a CAM cell in accordance with the invention.

Referring to FIG. 3, the general architecture of a CAM cell shall now be described. Identified on this cell is the first memory circuit 10, the second memory circuit 12 and the comparison circuit 14.

The first memory circuit 10 and the second memory circuit 12 each comprise first and second sets of transistors E1, E'1, S2, E'2. The first memory circuit 10 is for storing first compare data dt and second compare data df in the first and second sets of transistors, respectively.

Each first and second set of transistors E1 and S2 of the first memory circuit 10 comprises a first n-type MOS transistor, N1 and N2 respectively, and a p-type second transistor, P1 and P2 respectively.

These transistors are connected in the following manner. The source of the MOS transistor of type P, P1 or P2, is connected to a supply potential Vdd. The drain of the transistors P1 and P2 is connected to the drain of the transistors of type N, N1 and N2, while the source of these transistors N1 and N2 is connected to a zero potential Vss. The gate of each PMOS transistor P1 and P2 is connected to the gate of a corresponding NMOS transistor N1 and N2, and provides a data value dt or df to the comparison circuit 14.

As shown in FIG. 3, there is a relation to the first set of transistors E1. The common node between the drain of the PMOS transistor P1 and the drain of the NMOS transistor N1 is connected to the drain of an nMOS access transistor T4, the source of which is connected to a bit line BLF. The gate of this access transistor T4 is connected to a word line WLD. Likewise, the drain of the transistors N1 and P1 is connected to the gate of the transistors N2 and P2 of the second set of transistors.

The transistors of the second set of transistors are connected in a similar manner. In other words, the drain of the PMOS transistor P2 and of the NMOS transistor N2 is connected to the drain of an access transistor T3, the source of which is connected to a bit line BLT. The gate of this access transistor T3 is connected to a word line WLD.

As also shown in FIG. 3, the sets of transistors E'1, E'2 of the second memory circuit 12 have a similar structure to the sets of transistors E1 and S2. They are each made up of an NMOS transistor N3 or N4 and a PMOS transistor P3 or P4. The gate of the NMOS transistor N3 or N4 is connected to the gate of the transistor P3 or P4.

Furthermore, the gate of each transistor of each set of transistors of the second memory circuit is connected to the drain of each transistor of the other set of transistors. The drain of each NMOS and PMOS storage transistor is connected to the drain of an access transistor T1 or T2, the source of which is connected to one of the bit lines BLT or BLF. The gate of these access transistors T1 or T2 is connected to a word line WLM.

As indicated above, the first memory circuit is connected to the comparison circuit 14 to provide it with the compare data dt and df. The second memory circuit 12 is also connected to the comparison circuit 14 to deliver thereto masking data MT used to enable or disable the result of a comparison.

The comparison circuit 14 also comprises two sets of transistors S"1 and S"2 each comprising two comparison transistors N5, N7 and N8, N10, and an enabling transistor N6 and N9.

These transistors are connected in the following manner. The gate of the first comparison transistors N5 and N8 of the two sets of transistors S"1 and S"2 receives stored data dt or df. The gate of the second comparison transistors N7 and N10 receives compare data ct or cf. The gate of the enabling transistor N6 or N9 receives the enabling or disabling signal MT.

Furthermore, the source of the transistors N5 and N8 is connected to the potential Vss. The drain of these transistors N5 and N8 is connected to the source of the enabling transistors N6 and N9. The drain of the enabling transistors N6 and N9 is connected to the source of the second comparison transistors N7 and N10, while the drain of these transistors N7 and N10 is connected to the line C delivering the correspondence signal.

Still referring to FIG. 3, each first and second set of transistors S"1 and S"2 of the comparison circuit 14 is completed by an isolation transistor N11 and N12, the gate of which is connected to the potential Vss. One of the drain and source of these transistors is connected to the drain of the second comparison transistors N7 and N10, and the other to a corresponding isolation transistor of an adjacent CAM cell of the same matrix.

Figure 4:
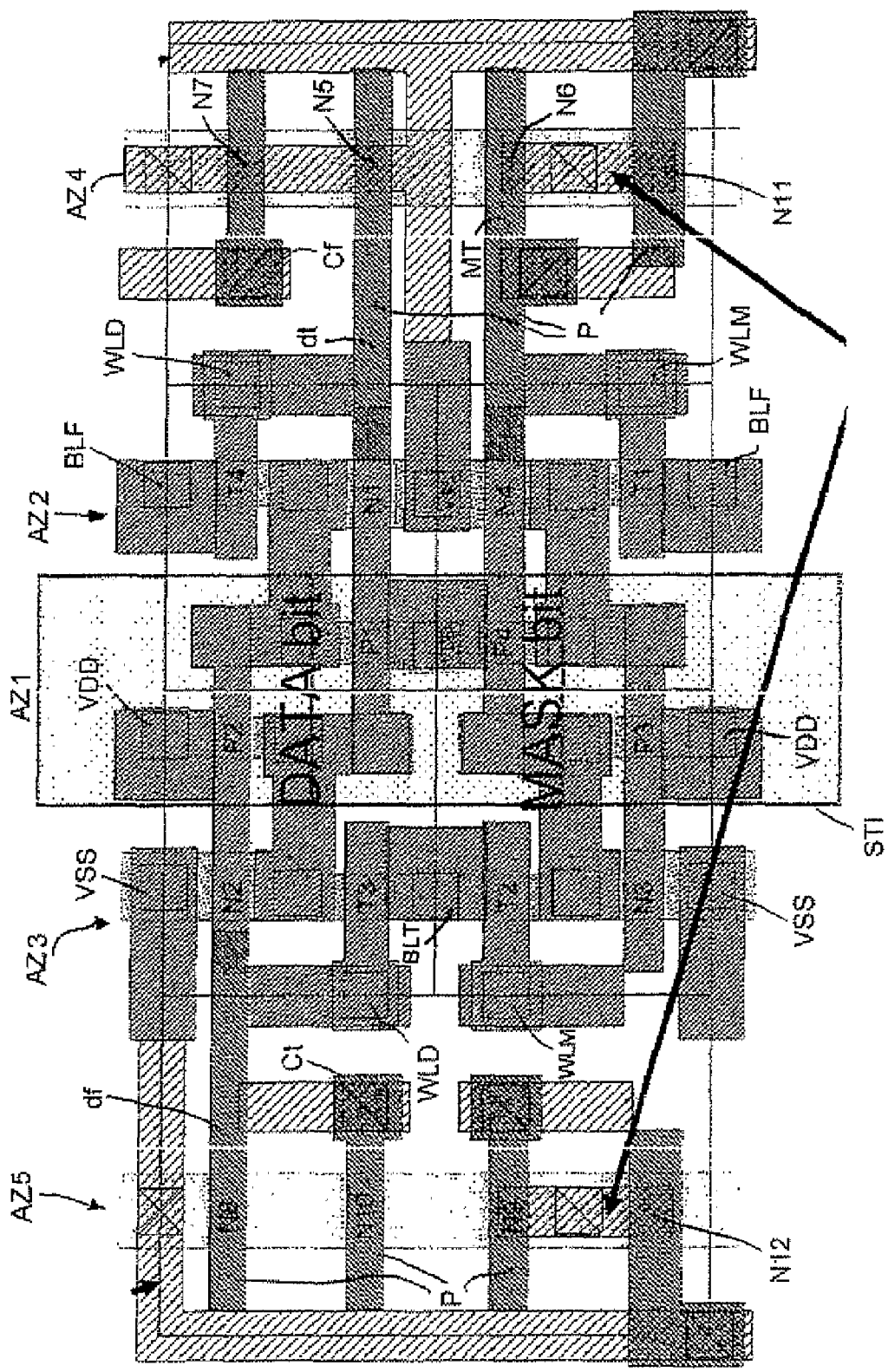
FIG. 4 shows an installation example of a CAM cell in accordance with the invention.

FIG. 4 shows an exemplary embodiment of the CAM cell of FIG. 3 on a silicon substrate. The transistors of the memory circuits 10 and 12 and of the comparison circuit 14 are formed in respective active zones ZA1, ZA2, ZA3, ZA4, and ZA5. Each of these active zones is isolated from the rest of the substrate by a lateral STI (Shallow Trench Isolation) region.

As shown in FIG. 4, in the considered exemplary embodiment, the PMOS transistors P1, P2, P3 and P4 of the first and second memory circuits 10 and 12 are installed in a first active zone ZA1. The NMOS transistors N1, N4, and the corresponding access transistors T1 and T4 of the first set of transistors E1 and E'1 of the first and second memory circuits are installed in a second active zone ZA2.

The NMOS transistors N2, N3, and the corresponding access transistors T2, T3 of the second sets of transistors S2, E'2 of the first and second memory circuits are formed in a third active zone ZA3. The NMOS transistors N5, N6, N7, N11 of the first set of transistors S"1 of the comparison circuit 14 are formed on a fourth active zone ZA4. Finally, the transistors N8, N9, N10 and N12 of the second set of transistors S"2 of the comparison circuit 14 are formed on a fifth active zone ZA5.

Furthermore, the word line BLT to which are connected the transistors T2 and T3 of the second sets of transistors is formed on the third active zone ZA3. The word line BLF to which are connected the transistors T1 and T4 of the first sets of transistors is formed on the second active zone ZA2. The word lines WLD and WLM which drive the gate of the access transistors T3, T4, T1 and T2 are distributed among the second and third active zones ZA2 and ZA3.

As shown in FIG. 4, the active zones ZA2 and ZA3 are arranged on either side of the active zone ZA1 in which the PMOS transistors are installed. The active zones ZA4 and ZA5 are arranged on either side of the second and third active zones ZA2 and ZA3, opposite one another.

According to the arrangement shown, all of the transistors of the cell are vertically orientated as in FIG. 4. As a result of this arrangement, the polysilicon tracks P connect the gates of the storage transistors of the first and second memory circuits and the gates of the comparison transistors and the enabling transistors of the comparison circuit, i.e., the tracks carrying the data signals dt, df and MT all extend in a substantially straight manner. Unlike the installations according to the prior art, this avoids the formation of angles in the polysilicon tracks. This arrangement results in easier checking of the transistors.

It is also possible to increase the size of the transistors without dismantling the CAM cell. Referring now to FIG. 5, as pointed out above, the isolation transistors N11 and N12 are connected to corresponding isolation transistors of an adjacent CAM cell. This arrangement allows the strains imposed on the STIs to be considerably reduced.

That which is claimed:

1. A content addressable memory (CAM) cell comprising:
   a semiconductor substrate including a plurality of active zones;
   a first memory circuit comprising first and second sets of transistors for the storage of first and second compare data;
   a second memory circuit comprising first and second sets of transistors for the storage of data for enabling or disabling the CAM cell; and
   a comparison circuit for receiving first and second input data, and coupled to said first memory circuit for receiving the first and second compare data, and coupled to said second memory circuit for receiving an output signal therefrom, said comparison circuit comprising first and second sets of comparison transistors which respectively provide for comparison of the first and second compare data with the first and second input data under control of the output signal from said second memory circuit;
   said first and second sets of transistors of said first memory circuit and of said second memory circuit each comprising at least one transistor of a first conductivity type and at least one transistor of a second conductivity type;
   the transistors of the second conductivity type on a same first active zone of said semiconductor substrate, and the transistors of the first conductivity type of said first set of transistors and of said second set of transistors of said first and second memory circuits on second and third active zones, respectively, being separated by said first active zone;
   said first and second sets of comparison transistors of said comparison circuit are on fourth and fifth active zones, respectively, being mutually separated from the first active zone.

2. A CAM cell according to claim 1, wherein said first memory circuit comprises first and second word lines in the second and third active zones, respectively.

3. A CAM cell according to one of claim 1, wherein said first memory circuit comprises first and second bit lines in the second and third active zones, respectively.

4. A CAM cell according to claim 1, wherein said second memory circuit comprises first and second word lines in the second and third active zones, respectively.

5. A CAM cell according to claim 1, wherein second memory circuit comprises first and second bit lines in the second and third active zones, respectively.

6. A CAM cell according to claim 1, wherein at least one control terminal of the transistors of said first set of transistors of said first memory circuit is coupled to at least one control terminal of a comparison transistor of said first set of comparison transistors of said comparison circuit by a substantially straight track of polycrystalline silicon.

7. A CAM cell according to claim 1, wherein at least one control terminal of the transistors of said second set of transistors of said first memory circuit is coupled to at least one control terminal of a comparison transistor of said second set of comparison transistors of said comparison circuit by a substantially straight track of polycrystalline silicon.

8. A CAM cell according to claim 1, wherein at least one control terminal of the transistors of one of said first and second sets of transistors of said second memory circuit is connected to a control terminal of an enabling transistor of said first and second sets of comparison transistors of said comparison circuit by a substantially straight track of polycrystalline silicon.

9. A CAM cell according to claim 1, wherein said first and second sets of comparison transistors of said comparison circuit each comprises first and second comparison transistors and an enabling transistor, and said first and second sets of transistors each further comprises an isolation transistor connected to a corresponding isolation transistor of a comparison circuit of an adjacent CAM cell.

10. A content addressable memory (CAM) matrix comprising:
   a network of CAM cells coupled together, each CAP cell comprising
     a substrate including a plurality of active zones,
     a first memory circuit comprising first and second sets of transistors for the storage of first and second compare data, a second memory circuit comprising first and second sets of transistors for the storage of data for enabling or disabling the CAM cell, a comparison circuit for receiving first and second input data, and coupled to said first memory circuit for receiving the first and second compare data, and coupled to said second memory circuit for receiving an output signal therefrom, said comparison circuit comprising first and second sets of comparison transistors which respectively provide for comparison of the first and second compare data with the first and second input data under control of the output signal from said second memory circuit, said first and second sets of transistors of said first memory circuit and of said second memory circuit each comprising at Least one transistor of a first conductivity type and at least one transistor of a second conductivity type, the transistors of the second conductivity type on a same first active zone or said substrate, and the transistors of the first conductivity type of said first set of transistors and of said second set of transistors of said first and second memory circuits on second and third active zones, respectively, being separated by said first active zone, and said first and second sets of comparison transistors of said comparison circuit are on fourth and fifth active zones, respectively, being mutually separated from the first active zone.

11. A CAM matrix according to claim 10, wherein said first memory circuit comprises first and second word lines in the second and third active zones, respectively.

12. A CAM matrix according to claim 10, wherein said first memory circuit comprises first and second bit lines in the second and third active zones, respectively.

13. A CAM matrix according to claim 10, wherein said second memory circuit comprises first and second word lines in the second and third active zones, respectively.

14. A CAM matrix according to claim 10, wherein second memory circuit comprises first and second bit lines in the second and third active zones, respectively.

15. A CAN matrix according to claim 10, wherein at least one control terminal of the transistors of said first set of transistors of said first memory circuit is coupled to at least one control terminal of a comparison transistor of said first set of comparison transistors of said comparison circuit by a substantially straight track of polycrystalline silicon.

16. A CAM matrix according to claim 10, wherein at least one control terminal of the transistors of said second set of transistors of said first memory circuit is coupled to at least one control terminal of a comparison transistor of said second set of comparison transistors of said comparison circuit by a substantially straight track of polycrystalline silicon.

17. A CAM matrix according to claim 10, wherein at least one control terminal of the transistors of one of said first and second sets of transistors of said second memory circuit is connected to a control terminal of an enabling transistor of said first and second sets of comparison transistors of said comparison circuit by a substantially straight track of polycrystalline silicon.

18. A CAM matrix according to claim 10, wherein said first and second sets of comparison transistors of said comparison circuit each comprises first and second comparison transistors and an enabling transistor, and said first and second sets of transistors each further comprises an isolation transistor connected to a corresponding isolation transistor of a comparison circuit of an adjacent CAM cell.

19. A method for making a content addressable memory (CAM) cell comprising:

defining a plurality of active zones on a substrate;

forming a first memory circuit comprising first and second sets of transistors for the storage of first and second compare data;

forming a second memory circuit comprising first and second sets of transistors for the storage of data for enabling or disabling the CAM cell; and forming a comparison circuit for receiving first and second input data, and coupling to the first memory circuit for receiving the first and second compare data, and coupling to the second memory circuit for receiving an output signal therefrom, the comparison circuit comprising first and second sets of comparison transistors which respectively provide for comparison of the first and second compare data with the first and second input data under control of the output signal from the second memory circuit;

the first and second sets of transistors of the first memory circuit and of the second memory circuit each comprising at least one transistor of a first conductivity type and at least one transistor of a second conductivity type;

the transistors of the second conductivity type being formed on a same first active zone of the substrate, and the transistors of the first conductivity type of the first set of transistors and of the second set of transistors of the first and second memory circuits on second and third active zones, respectively, being separated by the first active zone;

the first and second sets of comparison transistors of the comparison circuit are on fourth and fifth active zones, respectively, being mutually separated from the first active zone.

20. A method according to claim 19, further comprising forming first and second word lines in the second and third active zones, respectively, for the first memory circuit.

21. A method according to claim 19, further comprising forming first and second bit lines in the second and third active zones, respectively, for the first memory circuit.

22. A method according to claim 19, further comprising forming first and second word lines in the second and third active zones, respectively, for the second memory circuit.

23. A method according to claim 19, further comprising forming first and second bit lines in the second and third active zones, respectively, for the second memory circuit.

24. A method according to claim 19, further comprising coupling at least one control terminal of the transistors of the first set of transistors of the first memory circuit to at least one control terminal of a comparison transistor of the first set of comparison transistors of the comparison circuit by a substantially straight track of polycrystalline silicon.

25. A method according to claim 19, further comprising coupling at least one control terminal of the transistors of the second set of transistors of the first memory circuit to at least one control terminal of a comparison transistor of the second set of comparison transistors of the comparison circuit by a substantially straight track of polycrystalline silicon.

26. A method according to claim 19, further comprising coupling at least one control terminal of the transistors of one of the first and second sets of transistors of the second memory circuit to a control terminal of an enabling transistor of the first and second sets of comparison transistors of the comparison circuit by a substantially straight track of polycrystalline silicon.

27. A method according to claim 19, wherein the first and second sets of comparison transistors of the comparison circuit each comprises first and second comparison transistors and an enabling transistor, and the first and second sets of transistors each further comprises an isolation transistor connected to a corresponding isolation transistor of a comparison circuit of an adjacent CAM cell.

* * * * *

UNITED STATES PATENT AND TRADEMARK OFFICE
CERTIFICATE OF CORRECTION

PATENT NO. : 7,280,378 B2  
APPLICATION NO. : 11/428471  
DATED : October 9, 2007  
INVENTOR(S) : Jacquet et al.

Page 1 of 1

It is certified that error appears in the above-identified patent and that said Letters Patent is hereby corrected as shown below:

| | |
|---|---|
| Column 6, Line 62 | Delete: "CAP" Insert: -- CAM -- |
| Column 7, Line 16 | Delete: "Least" Insert: -- least -- |
| Column 7, Line 20 | Delete: "or" Insert: -- of -- |
| Column 7, Line 43 | Delete: "CAN" Insert: -- CAM -- |

Signed and Sealed this

Twenty-fourth Day of June, 2008

JON W. DUDAS  
*Director of the United States Patent and Trademark Office*